United States Patent
Ramakrishnan et al.

(10) Patent No.: US 12,191,243 B2
(45) Date of Patent: Jan. 7, 2025

(54) CANTILEVERED POWER PLANES TO PROVIDE A RETURN CURRENT PATH FOR HIGH-SPEED SIGNALS

(71) Applicant: Avago Technologies International Sales Pte. Limited, Singapore (SG)

(72) Inventors: Arun Ramakrishnan, Lake Forest, CA (US); Dharmendra Saraswat, Foothill Ranch, CA (US); Reza Sharifi, Irvine, CA (US); Sam Zhao, Irvine, CA (US); Sam Karikalan, Ladera Ranch, CA (US); Mayank Mayukh, Fort Collins, CO (US); Liming Tsau, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 420 days.

(21) Appl. No.: 17/743,723

(22) Filed: May 13, 2022

(65) Prior Publication Data
US 2023/0369191 A1 Nov. 16, 2023

(51) Int. Cl.
*H01L 23/66* (2006.01)
*H01L 21/48* (2006.01)
(Continued)

(52) U.S. Cl.
CPC .... *H01L 23/49838* (2013.01); *H01L 21/4846* (2013.01); *H01L 23/66* (2013.01);
(Continued)

(58) Field of Classification Search
CPC .......... H01L 23/49838; H01L 21/4846; H01L 23/66; H01L 23/49827; H01L 25/16; H01L 2223/6666; H01L 23/5383; H01L 23/50

See application file for complete search history.

(56) References Cited

U.S. PATENT DOCUMENTS

| 7,692,101 | B2* | 4/2010 | Duong | H05K 1/0216 |
| | | | | 174/250 |
| 9,036,364 | B1* | 5/2015 | Fung | H05K 1/025 |
| | | | | 174/255 |

(Continued)

FOREIGN PATENT DOCUMENTS

WO WO 2015/116187 A1 8/2015

OTHER PUBLICATIONS

Ram Systems (Aug. 2020) "Layout guidelines for good Return Path in PCB" 7 pages.

(Continued)

*Primary Examiner* — David Vu
*Assistant Examiner* — Brandon C Fox
(74) *Attorney, Agent, or Firm* — Quarles & Brady LLP

(57) ABSTRACT

Novel tools and techniques are provided for implementing cantilevered power planes to provide a return current path for high-speed signals. In various embodiments, a semiconductor package includes a substrate core, a plurality of layers, and an AC coupler(s). The plurality of layers includes power, ground, and signal layers each layer disposed on or above the substrate core, each signal layer being disposed between a power layer and a ground layer, the power layer and the ground layer each providing a return path for high frequency (e.g., 1 kHz or greater) signals carried by each signal layer. Each dielectric layer is disposed between and in contact with a pair of power, ground, or signal layer. The AC coupler(s) is coupled to each of a power layer(s) and a ground layer(s), without any portion of any power layer that is near an edge of the substrate core being anchored to the substrate core.

20 Claims, 9 Drawing Sheets

(51) Int. Cl.
*H01L 23/498* (2006.01)
*H01L 23/50* (2006.01)
*H01L 23/538* (2006.01)
*H01L 25/16* (2023.01)

(52) U.S. Cl.
CPC ........ *H01L 23/49827* (2013.01); *H01L 23/50* (2013.01); *H01L 23/5383* (2013.01); *H01L 25/16* (2013.01); *H01L 2223/6666* (2013.01)

(56) References Cited

U.S. PATENT DOCUMENTS

| | | |
|---|---|---|
| 9,220,165 B2 | 12/2015 | Hayashi |
| 10,869,386 B2* | 12/2020 | Li ........................ H05K 1/0298 |
| 2004/0125580 A1 | 7/2004 | Chung et al. |
| 2005/0225955 A1 | 10/2005 | Grebenkemper et al. |
| 2006/0076160 A1 | 4/2006 | Hsu et al. |
| 2021/0159166 A1* | 5/2021 | Oikawa ................ H05K 1/0253 |

OTHER PUBLICATIONS

Sierra Circuits Team (Mar. 2021) "What is the Use of a Decoupling Capacitor?" 15 pages.
Yee, Chang Fei (Feb. 2020) "Stitching Capacitors: Technique of Crosstalk Mitigation for Imperfect Reference Plane" 7 pages.

* cited by examiner

CANTILEVERED POWER PLANES TO PROVIDE A RETURN CURRENT PATH FOR HIGH-SPEED SIGNALS

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing semiconductor technology, and, more particularly, to methods, systems, and apparatuses for implementing cantilevered power planes to provide a return current path for high-speed signals.

BACKGROUND

For typical semiconductor packages in which buildup layers of a substrate include ground, power, and signal layers for ground connection, power supply, and signals, respectively, return paths are carried along only ground layers. This requires ground layers (in some cases, additional ground layers) to be formed adjacent to signal layers (not including dielectric layers between adjacent pairs of the ground, power, and signal layers). Additional layers result in added costs for fabrication of the semiconductor packages.

Hence, there is a need for more robust and scalable solutions for implementing semiconductor technology, and, more particularly, to methods, systems, and apparatuses for implementing cantilevered power planes to provide a return current path for high-speed signals.

SUMMARY

The techniques of this disclosure generally relate to tools and techniques for implementing semiconductor technology, and, more particularly, to methods, systems, and apparatuses for implementing cantilevered power planes to provide a return current path for high-speed signals.

In an aspect, a semiconductor package comprises a semiconductor substrate comprising a core layer, a first plurality of layers disposed on or above the core layer, and at least one alternating current ("AC") coupler. The first plurality of layers comprises: one or more first power layers disposed on or above the core layer; one or more first ground layers disposed on or above the core layer; one or more first signal layers disposed on or above the core layer, each signal layer among the one or more first signal layers being disposed between a closest power layer among the one or more first power layers and a closest ground layer among the one or more first ground layers, the closest power layer and the closest ground layer each providing a return path for high frequency signals carried by said each signal layer; and a plurality of first dielectric layers, each dielectric layer being disposed between and in contact with two of a power layer among the one or more first power layers, a ground layer among the one or more first ground layers, or a signal layer among the one or more first signal layers. The at least one AC coupler is coupled to each of at least one power layer among the one or more first power layers and at least one ground layer among the one or more first ground layers, without any portion of any of the one or more first power layers that is within a first distance from an edge of the core layer being anchored to the core layer, the first distance being half a distance between the edge of the core layer and a closest edge of one of a semiconductor chip or a mount for the chip that is mounted on or above the semiconductor substrate.

In some embodiments, each AC coupler among the at least one AC coupler is configured to reduce noise signals carried by each of the at least one first power layer to which it is coupled. In some instances, the at least one AC coupler is disposed on or above the first plurality of layers. In some cases, the at least one AC coupler each comprises one of one or more capacitors, one or more inductors, one or more metal traces, one or more small gaps, one or more dielectric materials, or one or more structures with dielectric substructures, and/or the like. Alternatively, or additionally, at least a portion of the at least one AC coupler is disposed within the first plurality of layers. In some cases, the at least a portion of the at least one AC coupler each comprises one of one or more capacitors, one or more inductors, one or more metal traces, one or more small gaps, one or more vias, one or more dielectric materials, or one or more structures with dielectric sub-structures, and/or the like. In some instances, the closest power layer and the closest ground layer to each signal layer each provides a return path for high frequency signals carried by said each signal layer based on magnetic induction.

According to some embodiments, the first plurality of layers further comprises a solder mask layer as a top-most layer among other layers of the first plurality of layers. In some cases, the semiconductor package further comprises: the semiconductor chip that is mounted on or above the top-most layer of the first plurality of layers; and at least one decoupling capacitor that is mounted on or above the top-most layer of the first plurality of layers in proximity to the semiconductor chip, the at least one decoupling capacitor being coupled to a top-most power layer among the one or more first power layers and a ground layer among the one or more first ground layers, the at least one decoupling capacitor being configured to reduce or prevent rapid power supply fluctuations.

In some embodiments, the core layer comprises a top surface and a bottom surface. The first plurality of layers is disposed on or above the top surface of the core layer. In some cases, the semiconductor package further comprises a second plurality of layers disposed on or below the bottom surface of the core layer, at least one signal anchor disposed on or below a bottom-most layer of the second plurality of layers that is furthest from the core layer, and at least one ground anchor disposed on or below the bottom-most layer of the second plurality of layers. In some instances, the second plurality of layers comprises: one or more second power layers disposed on or below the core layer; one or more second ground layers disposed on or below the core layer; one or more second signal layers disposed on or below the core layer, each signal layer among the one or more second signal layers being disposed between a closest power layer among the one or more second power layers and a closest ground layer among the one or more second ground layers, the closest power layer and the closest ground layer each providing a return path for high frequency signals carried by said each signal layer; and a plurality of second dielectric layers, each dielectric layer being disposed between and in contact with two of a power layer among the one or more second power layers, a ground layer among the one or more second ground layers, or a signal layer among the one or more second signal layers. In some instances, the at least one signal anchor is connected to the one or more signal layers of the first plurality of layers and the one or more second signal layers of the second plurality of layers near the edge of the core layer and through the core layer, thereby anchoring the one or more signal layers of the first plurality of layers and the one or more second signal layers of the second plurality of layers that are near the edge of the core layer to the core layer. In some cases, the at least one ground anchor is connected to the one or more ground layers of the first plurality of layers and the one or more second ground layers of the second plurality of layers near the edge of the core layer and through the core layer, thereby anchoring the one or more ground layers of the first plurality of layers and the one or more second ground layers of the second plurality of layers that are near the edge of the core layer to the core layer.

In some instances, the at least one AC coupler is coupled to two or more of the at least one power layer among the one or more first power layers, the at least one ground layer among the one or more first ground layers, at least one power layer among the one or more second power layers, or at least one ground layer among the one or more second ground layers, without any portion of any of the one or more first power layers and the one or more second power layers that is near the edge of the core layer being anchored to the core layer. In some cases, a ground layer of the one or more first ground layers is at least one of a top-most layer of the first plurality of layers and a bottom-most layer of the first plurality of layers, wherein a ground layer of the one or more second ground layers is at least one of a top-most layer of the second plurality of layers and a bottom-most layer of the second plurality of layers.

According to some embodiments, the first plurality of layers comprises: a first ground layer among the one or more first ground layers that is disposed on or above the core layer; a first dielectric layer among the one or more first dielectric layers on the first ground layer; a first power layer among the one or more first power layers that is disposed on the first dielectric layer; a second dielectric layer among the one or more first dielectric layers on the first power layer; a first signal layer among the one or more first signal layers that is disposed on the second dielectric layer; a third dielectric layer among the one or more first dielectric layers on the first signal layer; a second ground layer among the one or more first ground layers that is disposed on the third dielectric layer; a fourth dielectric layer among the one or more first dielectric layers on the second ground layer; a second signal layer among the one or more first signal layers that is disposed on the fourth dielectric layer; a fifth dielectric layer among the one or more first dielectric layers on the second signal layer; a second power layer among the one or more first power layers that is disposed on the fifth dielectric layer; a sixth dielectric layer among the one or more first dielectric layers on the second power layer; a third signal layer among the one or more first signal layers that is disposed on the sixth dielectric layer; a seventh dielectric layer among the one or more first dielectric layers on the third signal layer; and a third ground layer among the one or more first ground layers that is disposed on the seventh dielectric layer. In some cases, the first power layer and the second ground layer each provides a return path for high frequency signals carried by the first signal layer. In some instances, the second ground layer and the second power layer each provides a return path for high frequency signals carried by the second signal layer. In some cases, the second power layer and the third ground layer each provides a return path for high frequency signals carried by the third signal layer.

In another aspect, a method comprises: forming a first plurality of layers disposed on or above a core layer of a semiconductor substrate, comprising: forming a first ground layer among one or more first ground layers on the core layer; forming a first dielectric layer among one or more first dielectric layers on the first ground layer; forming a first power layer among one or more first power layers on the first dielectric layer; forming a second dielectric layer among the one or more first dielectric layers on the first power layer; forming a first signal layer among one or more first signal layers on the second dielectric layer; forming a third dielectric layer among the one or more first dielectric layers on the first signal layer; and forming a second ground layer among the one or more first ground layers on the third dielectric layer, wherein the first power layer and the second ground layer each provides a return path for high frequency signals carried by the first signal layer. The method further comprises mounting at least one alternating current ("AC") coupler on or above the first plurality of layers and coupling the at least one AC coupler to each of at least one power layer among the one or more first power layers and at least one ground layer among the one or more first ground layers, without any portion of any of the one or more first power layers that is within a first distance from an edge of the core layer being anchored to the core layer, the first distance being half a distance between the edge of the core layer and a closest edge of one of a semiconductor chip or a mount for the chip that is mounted on or above the semiconductor substrate.

In some embodiments, each AC coupler among the at least one AC coupler is configured to reduce noise signals carried by each of the at least one power layer to which it is coupled. In some instances, the at least one AC coupler each comprises one of one or more capacitors, one or more inductors, one or more metal traces, one or more small gaps, one or more dielectric materials, or one or more structures with dielectric sub-structures, and/or the like. Alternatively, or additionally, at least a portion of the at least one AC coupler is disposed within the first plurality of layers. In some cases, the at least a portion of the at least one AC coupler each comprises one of one or more capacitors, one or more inductors, one or more metal traces, one or more small gaps, one or more vias, one or more dielectric materials, or one or more structures with dielectric sub-structures, and/or the like.

According to some embodiments, the method further comprises: forming a solder mask layer as a top-most layer among other layers of the first plurality of layers; mounting the semiconductor chip on or above the top-most layer of the first plurality of layers; and mounting at least one decoupling capacitor on or above the top-most layer of the first plurality of layers in proximity to the semiconductor chip, the at least one decoupling capacitor being coupled to a top-most power layer among the one or more first power layers and a ground layer among the one or more first ground layers, the at least one decoupling capacitor being configured to reduce or prevent rapid power supply fluctuations.

In some embodiments, forming the first plurality of layers further comprises: forming a fourth dielectric layer among one or more first dielectric layers on the second ground layer; forming a second signal layer among one or more first signal layers on the fourth dielectric layer; forming a fifth dielectric layer among the one or more first dielectric layers on the second signal layer; forming a second power layer among one or more first power layers on the fifth dielectric layer; forming a sixth dielectric layer among the one or more first dielectric layers on the second power layer; forming a third signal layer among one or more first signal layers on the sixth dielectric layer; forming a seventh dielectric layer among the one or more first dielectric layers on the third signal layer; and forming a third ground layer among the one or more first ground layers on the seventh dielectric layer. In some instances, the second ground layer and the second power layer each provides a return path for high frequency signals carried by the second signal layer. In some cases, the second power layer and the third ground layer each provides a return path for high frequency signals carried by the third signal layer.

According to some embodiments, the core layer comprises a top surface and a bottom surface. The first plurality of layers is disposed on or above the top surface of the core layer. In some instances, the method further comprises: forming a second plurality of layers disposed on or below the core layer, comprising: rotating the semiconductor package such that the bottom surface of the core layer faces upward; forming a first ground layer among one or more second ground layers on or above the bottom surface of the core layer; forming a first dielectric layer among one or more second dielectric layers on the first ground layer; forming a first power layer among one or more second power layers on the first dielectric layer; forming a second dielectric layer among the one or more second dielectric layers on the first power layer; forming a first signal layer among one or more second signal layers on the second dielectric layer; forming a third dielectric layer among the one or more second dielectric layers on the first signal layer; and forming a second ground layer among the one or more second ground layers on the third dielectric layer. In some cases, the first power layer and the second ground layer each provides a return path for high frequency signals carried by the first signal layer.

In some embodiments, the at least one AC coupler is coupled to two or more of the at least one power layer among the one or more first power layers, the at least one ground layer among the one or more first ground layers, at least one power layer among the one or more second power layers, or at least one ground layer among the one or more second ground layers, without any portion of any of the one or more first power layers and the one or more second power layers that is near the edge of the core layer being anchored to the core layer.

According to some embodiments, the method further comprises: forming a solder mask layer as a bottom-most layer among other layers of the second plurality of layers that is furthest from the core layer, when the semiconductor package is rotated such that the first plurality of layers is facing upward and the second plurality of layers is facing downward; forming at least one first solder anchor as at least one signal anchor on or above the bottom-most layer of the second plurality of layers, the at least one signal anchor being connected, using corresponding at least one anchor via, to the one or more signal layers of the first plurality of layers and the one or more second signal layers of the second plurality of layers near the edge of the core layer and through the core layer, thereby anchoring the one or more signal layers of the first plurality of layers and the one or more second signal layers of the second plurality of layers that are near the edge of the core layer to the core layer; forming at least one second solder anchor as at least one ground anchor on or above the bottom-most layer of the second plurality of layers, the at least one ground anchor being connected, using corresponding at least one anchor via, to the one or more ground layers of the first plurality of layers and the one or more second ground layers of the second plurality of layers near the edge of the core layer and through the core layer, thereby anchoring the one or more ground layers of the first plurality of layers and the one or more second ground layers of the second plurality of layers that are near the edge of the core layer to the core layer.

In some embodiments, each of the at least one anchor via is formed by a process comprising one of: forming a hole through all intervening layers among the first and second plurality of layers and filling the hole with a conductive material, wherein a corresponding one of the at least one signal anchor or the at least one ground anchor is formed to make contact with the conductive material; or forming a hole through each intervening layer among the first and second plurality of layers and filling the hole with a conductive material after each intervening layer has been formed and before a next intervening layer is formed, and repeating hole formation and hole filling until all the at least one anchor via has been formed in all intervening layers, wherein a corresponding one of the at least one signal anchor or the at least one ground anchor is formed to make contact with the conductive material; and/or the like.

Various modifications and additions can be made to the embodiments discussed without departing from the scope of the invention. For example, while the embodiments described above refer to particular features, the scope of this invention also includes embodiments having different combination of features and embodiments that do not include all of the above-described features.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Overview

Figure 1:
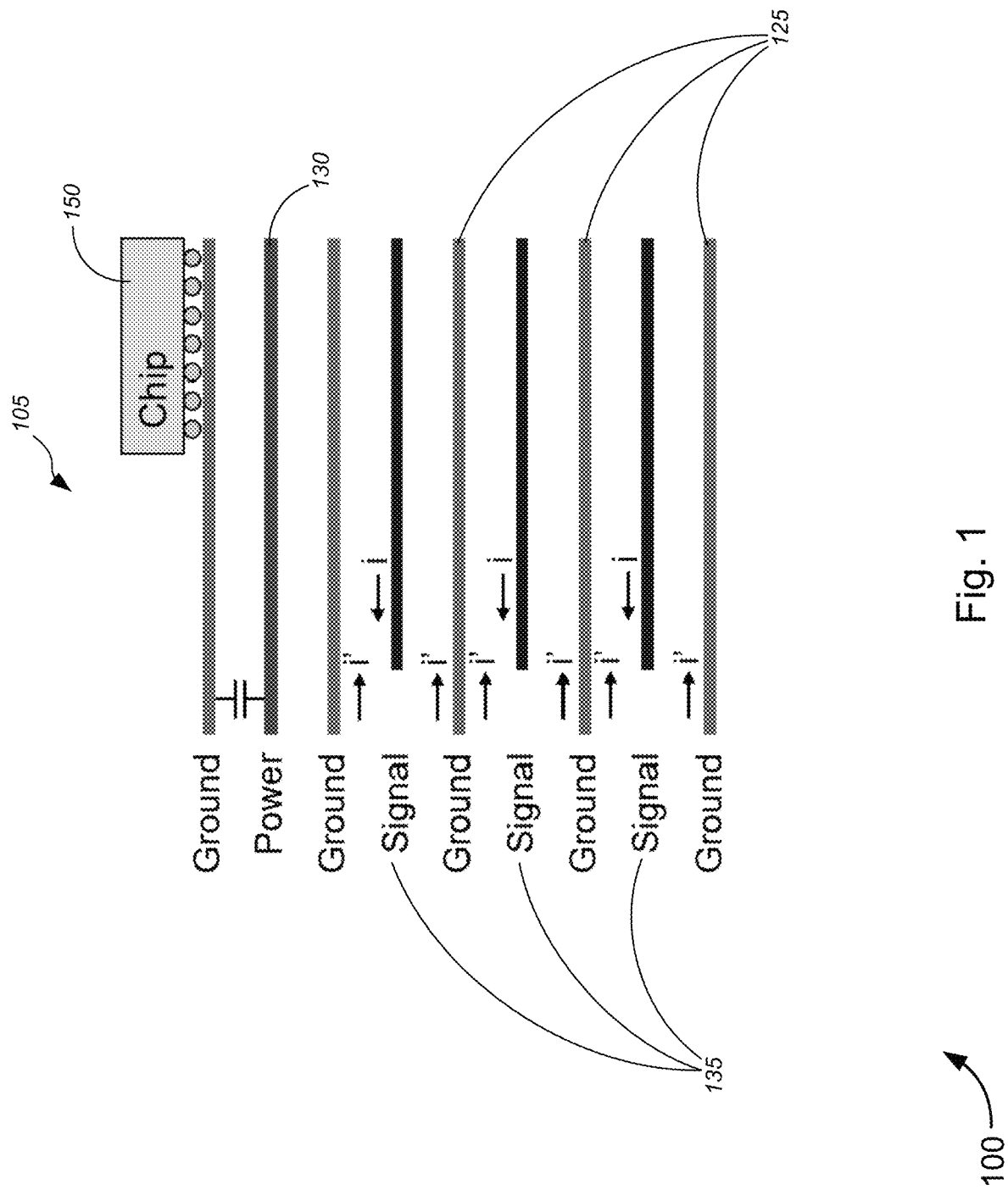
FIG. 1 is a schematic diagram illustrating a side view of an example of a configuration of a semiconductor package with return current paths only along adjacent ground planes.

Various embodiments provide tools and techniques for implementing semiconductor technology, and, more particularly, to methods, systems, and apparatuses for implementing cantilevered power planes to provide a return current path for high-speed signals.

In various embodiments, a semiconductor package comprises a semiconductor substrate comprising a core layer, a first plurality of layers disposed on or above the core layer, and at least one alternating current ("AC") coupler. The first plurality of layers comprises: one or more first power layers disposed on or above the core layer; one or more first ground layers disposed on or above the core layer; one or more first signal layers disposed on or above the core layer, each signal layer among the one or more first signal layers being disposed between a closest power layer among the one or more first power layers and a closest ground layer among the one or more first ground layers, the closest power layer and the closest ground layer each providing a return path for high frequency signals carried by said each signal layer; and a plurality of first dielectric layers, each dielectric layer being disposed between and in contact with two of a power layer among the one or more first power layers, a ground layer among the one or more first ground layers, or a signal layer among the one or more first signal layers. The at least one AC coupler is coupled to each of at least one power layer among the one or more first power layers and at least one ground layer among the one or more first ground layers, without any portion of any of the one or more first power layers that is within a first distance from an edge of the core layer being anchored to the core layer, the first distance being half a distance between the edge of the core layer and a closest edge of one of a semiconductor chip or a mount for the chip that is mounted on or above the semiconductor substrate.

In the various aspects described herein, various examples of a semiconductor package and a method are provided for implementing cantilevered power planes to provide a return current path for high-speed signals. This allows for power layers (or power planes) to be used (together with ground layers or ground planes) as return paths for high frequency (or high speed) signals carried on signal layers, without significant crosstalk (e.g., due to the presence of power balls anchoring the power layers to the edge of substrate base or core layer, or the like). AC couplers anchor the ground layers and the power layers without any portion of any power layer that is near an edge of the substrate core being anchored to the substrate core. The AC couplers may also serve to reduce noise signals carried by any of the power layers to which they are coupled. With these features, cost savings may be achieved (with the use of fewer layers, etc.) while achieving desired performance of the semiconductor chip without undue signal degradation (e.g., such as crosstalk due to power balls, or the like).

These and other aspects of the semiconductor package and method for implementing cantilevered power planes to provide a return current path for high-speed signals are described in greater detail with respect to the figures.

The following detailed description illustrates a few embodiments in further detail to enable one of skill in the art to practice such embodiments. The described examples are provided for illustrative purposes and are not intended to limit the scope of the invention.

In the following description, for the purposes of explanation, numerous details are set forth in order to provide a thorough understanding of the described embodiments. It will be apparent to one skilled in the art, however, that other embodiments of the present invention may be practiced without some of these details. In other instances, some structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Some Embodiments

We now turn to the embodiments as illustrated by the drawings. FIGS. 1-5 illustrate some of the features of the method, system, and apparatus for implementing semiconductor technology, and, more particularly, to methods, systems, and apparatuses for implementing cantilevered power planes to provide a return current path for high-speed signals, as referred to above. The methods, systems, and apparatuses illustrated by FIGS. 1-5 refer to examples of different embodiments that include various components and steps, which can be considered alternatives or which can be used in conjunction with one another in the various embodiments. The description of the illustrated methods, systems, and apparatuses shown in FIGS. 1-5 is provided for purposes of illustration and should not be considered to limit the scope of the different embodiments.

With reference to the figures, FIG. 1 is a schematic diagram illustrating a side view of an example 100 of a configuration of a semiconductor package with return current paths only along adjacent ground planes.

Figure 4:
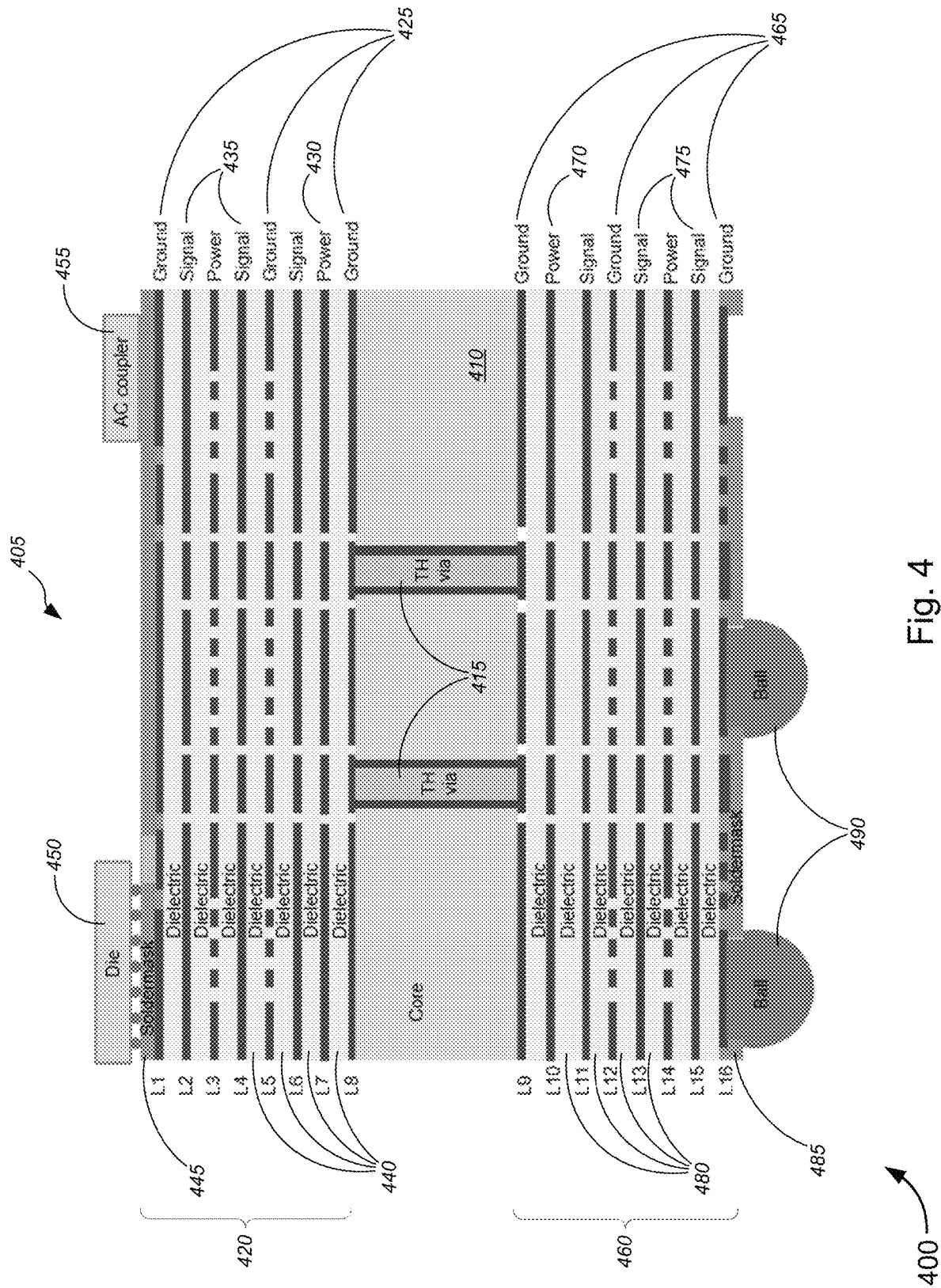
FIG. 4 is a schematic diagram illustrating a side cut-out view of a non-limiting example of a semiconductor package for implementing cantilevered power planes to provide a return current path for high-speed signals, in accordance with various embodiments.

As shown in FIG. 1, semiconductor package 105 includes a ground layer 125 for every other layer of the substrate, with a power layer 130 disposed between the top-most ground layer 125 and the next top-most ground layer 125, and with signal layers 135 sandwiched or disposed between two of the other ground layers 125 (e.g., in a "G/S/G stackup" or "G/S/G arrangement" or the like). Although not shown in FIG. 1, each adjacent pair of these layers sandwiches a dielectric layer in a manner similar to the first and second plurality of layers 420 and 460 as shown in FIG. 4, or the like. Semiconductor package 105 further includes a semiconductor chip 150 that is mounted on or above the top-most layer (in this case, the top-most ground layer 125).

Also shown in FIG. 1, only ground layers 125 that are adjacent to the signal layers 135 serve as return paths (denoted by "i'" in FIG. 1) for current that is carried by each of said signal layers 135 (denoted by "i" in FIG. 1). This results in additional layers (in this case, nine non-dielectric layers), compared with eight non-dielectric layers as shown in FIGS. 2B, 3A, and 4, or the like.

Figures 2A, 2B:
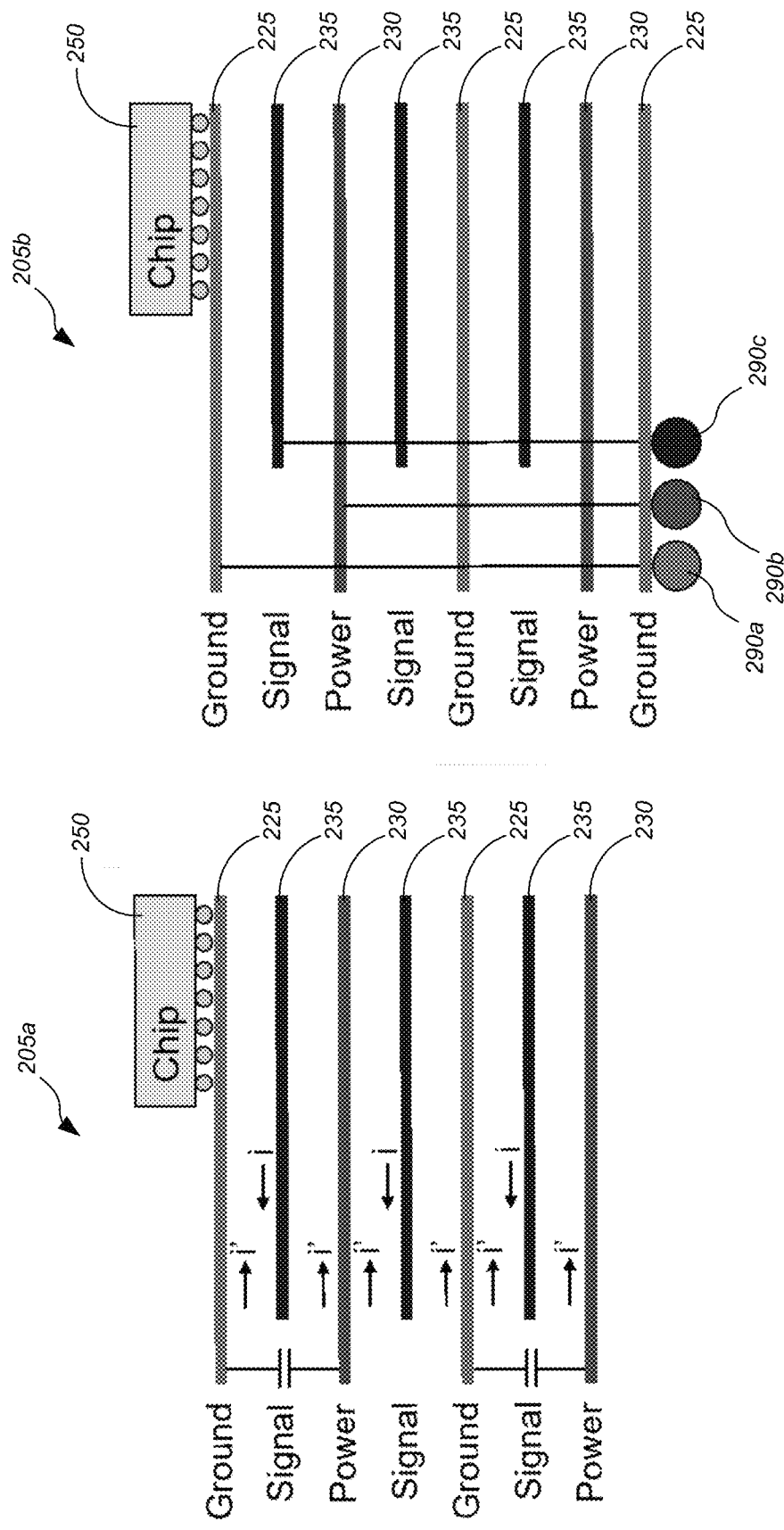
FIGS. 2A and 2B are schematic diagrams illustrating side views of various non-limiting examples of a semiconductor package with power planes to provide return current paths for high-speed signals, in accordance with various embodiments.
Figures 3A, 3B:
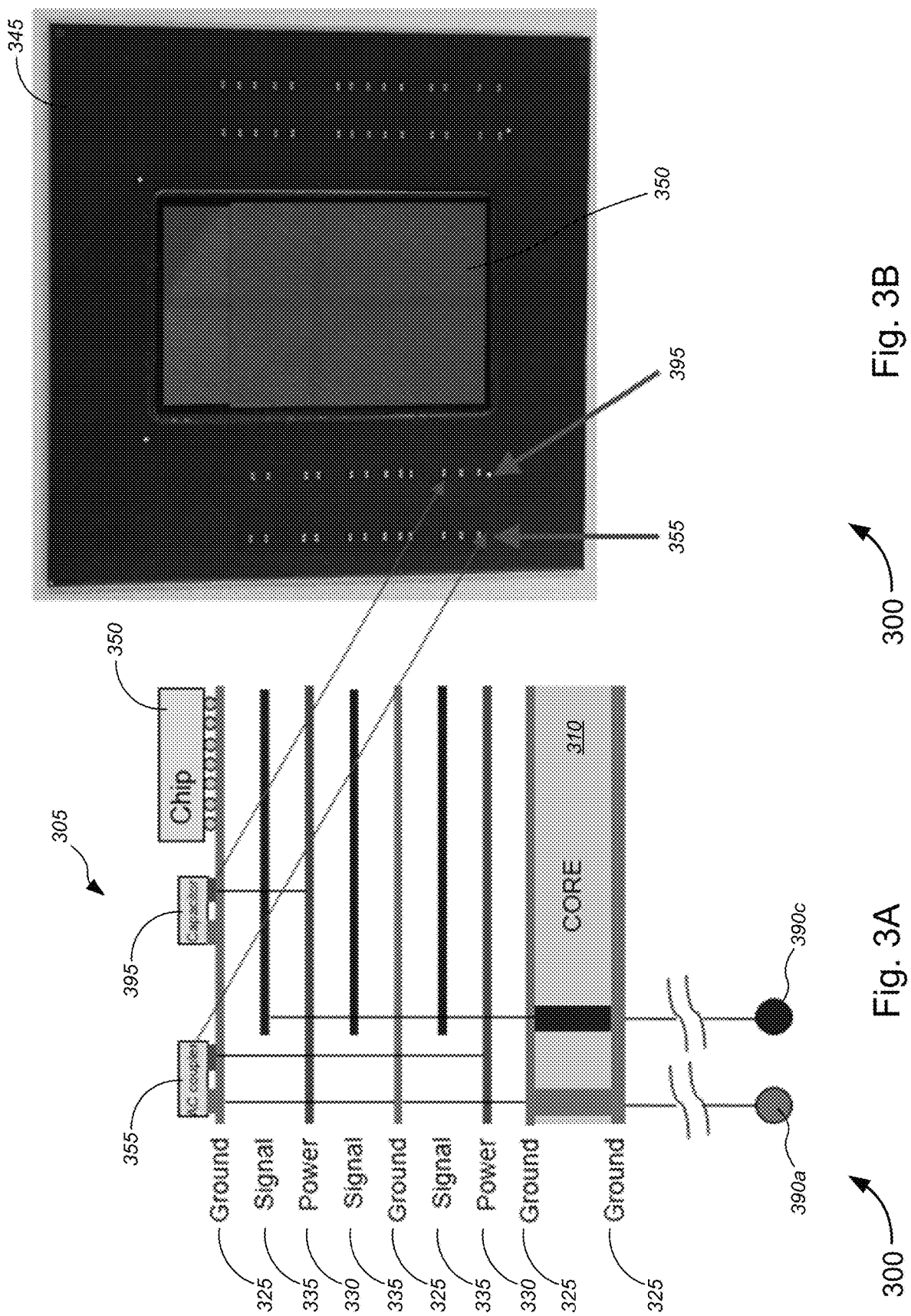
FIGS. 3A and 3B are schematic diagrams illustrating a side view and a top view of a non-limiting example of a semiconductor package for implementing cantilevered power planes to provide a return current path for high-speed signals, in accordance with various embodiments.

FIGS. 2A and 2B (collectively, "FIG. 2") are schematic diagrams illustrating side views of various non-limiting examples 200 and 200' of a semiconductor package with power planes to provide return current paths for high-speed signals, in accordance with various embodiments.

As shown in the non-limiting example 200 of FIG. 2A, semiconductor package 205a, like semiconductor package 105 of FIG. 1, includes one or more ground layers 225; one or more power layers 230; and one or more signal layers 235. Each signal layer among the one or more signal layers 235 is disposed between a closest power layer among the one or more first power layers 230 and a closest ground layer among the one or more first ground layers 225 (e.g., in a "G/S/P stackup" or "G/S/P arrangement" or the like). Although not shown in FIG. 2A, each adjacent pair of these layers sandwiches a dielectric layer in a manner similar to the first and second plurality of layers 420 and 460 as shown in FIG. 4, or the like. Semiconductor package 205a further includes a semiconductor chip 250 that is mounted on or above the top-most layer (in this case, the top-most ground layer 225).

Also shown in FIG. 2A, the closest power layer 230 and the closest ground layer 225 each provide a return path (denoted by "i'" in FIG. 2A) for high frequency signals carried by said each signal layer 235 (denoted by "i" in FIG. 2). As discussed below with respect to FIG. 4, this enables high frequency (or high speed) signals to be routed between ground and power layers (or planes), instead of between ground planes only (such as shown in FIG. 1), thereby potentially reducing the substrate layer count. That is, the G/S/P arrangement requires fewer substrate layers compared with a G/S/G arrangement for equivalent number of signal layers.

With reference to FIG. 2B, semiconductor package 205b is similar, if not identical to semiconductor package 205a at least in terms of layers 225-235 and their relative order within the plurality of layers and the semiconductor chip 250, or the like. In some cases, like in the first plurality of layers 420 of FIG. 4, a ground layer 225 is disposed as the bottom-most layer.

In some approaches, each of the one or more ground layers 225, the one or more power layers 230, and the one or more signal layers 235 (or portions thereof) that are near an edge of the substrate base or core layer may be anchored (e.g., to the substrate base or core layer, such as substrate base or core layer 410 of FIG. 4, or the like) using anchor ball(s) 290a (also referred to as "ground ball 290a" or "ground anchor 290a" or the like), anchor ball(s) 290b (also referred to as "power ball 290b" or "power anchor 290b" or the like), and anchor ball(s) 290c (also referred to as "signal ball 290c" or "signal anchor 290c" or the like), respectively. However, the presence of power balls or anchors among the high frequency (or high speed) signals increases the crosstalk between the high-speed signals, which neutralizes any cost savings with the use of power planes as return paths. Herein, "anchoring" or "being anchored" may refer to a particular layer(s) (e.g., power layer(s), signal layer(s), or ground layer(s), etc.) being mechanically coupled to a corresponding anchor or anchor ball using conductive vias through intervening layers between said particular layer(s) and the corresponding anchor or anchor ball, while being electrically isolated (using dielectric or non-conductive material) between the conductive vias and the intervening layers that are not the same type (e.g., for signal layers, the conductive layers electrically connect intervening signal layers, but are electrically isolated from intervening power layers and ground layers; and likewise for power and ground layers; etc.). Since the conductive vias pass through, and are part of, the substrate core layer, the particular layer(s) are also mechanically "anchored" to the substrate core layer.

FIGS. 3A and 3B (collectively, "FIG. 3") are schematic diagrams illustrating a side view and a top view, respectively, of a non-limiting example 300 of a semiconductor package for implementing cantilevered power planes to provide a return current path for high-speed signals, in accordance with various embodiments.

As shown in the non-limiting example 300 of FIGS. 3A and 3B, semiconductor package 305, like semiconductor package 405 of FIG. 4, includes one or more ground layers 325; one or more power layers 330; and one or more signal layers 335. Each signal layer among the one or more signal layers 335 is disposed between a closest power layer among the one or more first power layers 330 and a closest ground layer among the one or more first ground layers 325. Although not shown in FIG. 3A, each adjacent pair of these layers sandwiches a dielectric layer in a manner similar to the first and second plurality of layers 420 and 460 as shown in FIG. 4, or the like.

Semiconductor package 305 further includes a semiconductor chip 350 that is mounted on or above the top-most layer (in this case, the top-most ground layer 325) and a decoupling capacitor 395 that is disposed (or mounted) on or above the top-most ground layer 325 and that couples the top-most ground layer 325 and the closest power layer 330.

Unlike semiconductor package 205b in FIG. 2B, in the non-limiting example 300 of FIG. 3, semiconductor package 305 removes all power balls from the high frequency (or high speed) signal field (or does not include power balls during fabrication), while including at least one AC coupler 355 (similar to AC coupler 455 of FIG. 4, or the like) to anchor the power layers 330 and the ground layers 325 (or portions thereof) that are near an edge of the substrate core or substrate base or core layer 310 (such as shown in FIGS. 3A and 3B), without any of the power layers (or portions thereof) that are near an edge of the substrate base or core layer being anchored to the substrate base or core layer (thereby resulting in "cantilevered" power layers, as the power layers are anchored to substrate base or core layer 310 at a portion that is proximate to the semiconductor chip 350 (e.g., anchored to a middle portion of the substrate base or core layer 310) but not anchored to the substrate layer 310 near an edge of the substrate layer 310). Herein, "anchoring" or "being anchored" may refer to a particular layer(s) (e.g., signal layer(s), or ground layer(s), etc.) being mechanically coupled to a corresponding anchor or anchor ball using conductive vias through intervening layers between said particular layer(s) and the corresponding anchor or anchor ball, while being electrically isolated (using dielectric or non-conductive material) between the conductive vias and the intervening layers that are not the same type (e.g., for signal layers, the conductive layers electrically connect intervening signal layers, but are electrically isolated from intervening power layers and ground layers; and likewise for ground layers; etc.). Since the conductive vias pass through, and are part of, the substrate core layer, the particular layer(s) are also mechanically "anchored" to the substrate core layer. On the other hand, "not being anchored" may refer to the power layer(s) not being mechanically coupled to a power anchor or power ball using conductive vias through intervening layers between said power layer(s) and the power anchor or power ball (in fact, in these embodiments, there are no power anchors or power balls present). Herein, "near an edge of the substrate base or core layer" may refer to a region that is defined by half a distance between the edge of the substrate base or core layer and a closest edge of a semiconductor chip (or chip mount) that is mounted on or above the semiconductor substrate, extending from the edge. For example, with reference to FIG. 3B, "near" a left edge of the substrate core layer may be defined by a region extending from the left-most edge of the layer 345 (which corresponds to the dimensions of the substrate core 310) to a portion of the layer 345 between AC couplers 355 and the decoupling capacitors 395, or the like. The ground layers 325 and the signal layers 335 (or portions thereof) that are near the edge of the substrate base or core layer 310, however, may be anchored (e.g., to the substrate base or core layer 310, or the like) using anchor ball(s) 390*a* (also referred to as "ground ball 390*a*" or "ground anchor 390*a*" or the like) and anchor ball(s) 390*c* (also referred to as "signal ball 390*c*" or "signal anchor 390*c*" or the like), respectively, as the ground balls or anchors 390*a* and the signal balls or anchors 390*c* do not significantly affect the signals (unlike power balls, which increases crosstalk between high frequency (or high speed) signals). Similar to anchor balls 490 in FIG. 4, the anchor balls 390 may be disposed on or below a bottom-most layer of a second plurality of layers (not shown in FIG. 3A, but shown in FIG. 4) that is furthest from the substrate base or core layer 310.

In this manner, the power layers (or power planes) 330 may be used (together with the ground layers 325) as return paths for high frequency (or high speed) signals carried on signal layers 335, without significant crosstalk (e.g., due to the presence of power balls anchoring the power layers to the edge of substrate base or core layer, as shown in FIG. 2B, or the like). Accordingly, cost savings may be achieved (with the use of fewer layers, etc.) while achieving desired performance of the semiconductor chip without undue signal degradation (e.g., such as crosstalk due to power balls, or the like).

These and other functions of the example 300 (and its components) are described in greater detail herein with respect to FIGS. 4 and 5.

FIG. 4 is a schematic diagram illustrating a side cut-out view of a non-limiting example 400 of a semiconductor package for implementing cantilevered power planes to provide a return current path for high-speed signals, in accordance with various embodiments.

As shown in the non-limiting example 400 of FIG. 4, a semiconductor package 405 comprises a substrate core layer or substrate base layer 410, one or more vias 415 (including through-hole ("TH") vias, conductive vias, and/or dielectric vias, or the like), a first plurality of layers 420 disposed on (a top surface of) the substrate base or core layer 410, and a second plurality of layers 460 disposed on (a bottom surface of) the substrate base or core layer 410.

In some embodiments, the first plurality of layers 420 includes, without limitation: one or more first ground layers 425 (e.g., L1, L5, and L8 in FIG. 4, or the like) disposed on or above the substrate base or core layer 410; one or more first power layers 430 (e.g., L3 and L7 in FIG. 4, or the like) disposed on or above the substrate base or core layer 410; and one or more first signal layers 435 (e.g., L2, L4, and L6 in FIG. 4, or the like) disposed on or above the substrate base or core layer 410, each signal layer among the one or more first signal layers 435 being disposed between a closest power layer among the one or more first power layers 430 and a closest ground layer among the one or more first ground layers 425, the closest power layer 430 and the closest ground layer 425 each providing a return path for high frequency signals carried by said each signal layer 435. The first plurality of layers 420 further includes, but is not limited to, a plurality of first dielectric layers 440, each dielectric layer being disposed between and in contact with two of a power layer 430 among the one or more first power layers 430, a ground layer 425 among the one or more first ground layers 425, or a signal layer 435 among the one or more first signal layers 435. In some cases, each dielectric layer may include, without limitation, one of a single layer with uniform dielectric material throughout the single layer, a composite dielectric layer comprising multiple layers of different dielectric layers, a composite dielectric layer comprising multiple layers of the same dielectric layers with conductive layers disposed between pairs of dielectric layers, a composite dielectric layer comprising multiple layers of different dielectric layers with conductive layers disposed between pairs of dielectric layers, or a composite dielectric layer comprising multiple layers of sets of same dielectric layers together with sets of different dielectric layers with conductive layers disposed between pairs of (same and/or different) dielectric layers, and/or the like. In some instances, the conductive layers disposed between the dielectric layers may be made from same or different conductive materials.

Herein, a "power layer" may refer to one of (i) a layer (e.g., a "composite power layer" or the like) with one or more conductive traces communicatively coupled directly or indirectly to a power source or power supply, the one or more conductive traces being of any suitable shape or size (length, width, thickness, etc.) and being separated from other conductive traces by dielectric or non-conductive material or the like; or (ii) a layer (e.g., a "power plane" or the like) comprising a conductive material throughout with dielectric or non-conductive material in the form of non-conductive trace lines separating regions of adjacent conductive regions that are communicatively coupled to different power supply sources (e.g., for supplying components with different voltage and/or current needs, etc.) and/or separating regions around vias connecting components/conductive traces on other layers but not said (power) layer; and/or the like. Similarly, a "signal layer" may refer to one of (1) a layer (e.g., a "composite signal layer" or the like) with one or more conductive traces communicatively coupled directly or indirectly to a signal sources or relays, the one or more conductive traces being of any suitable shape or size (length, width, thickness, etc.) and being separated from other conductive traces by dielectric or non-conductive material or the like; or (2) a layer (e.g., a "signal plane" or the like) comprising a conductive material throughout with dielectric or non-conductive material in the form of non-conductive trace lines separating regions of adjacent conductive regions that are communicatively coupled to different signal sources or relays and/or separating regions around vias connecting components/conductive traces on other layers but not said (signal) layer; and/or the like. Likewise, a "ground layer" may refer to one of (a) a layer (e.g., a "composite ground layer" or the like) with one or more conductive traces communicatively coupled directly or indirectly to a circuit ground, the one or more conductive traces being of any suitable shape or size (length, width, thickness, etc.) and being separated from other conductive traces by dielectric or non-conductive material or the like; or (b) a layer (e.g., a "ground plane" or the like) comprising a conductive material throughout with dielectric or non-conductive material in the form of non-conductive trace lines separating regions around vias connecting components/conductive traces on other layers but not said (ground) layer; and/or the like. In some embodiments, the conductive trace lines (or non-conductive trace lines) need not be straight lines. For instance, the conductive trace lines or non-conductive trace lines may each include, without limitation, one or more traces that are each at least one of a straight line, a curved line, a patterned line, a labyrinthine line, a meandering line, a thick line, a thin line, or a combination thereof. In some cases, the conductive trace lines (or non-conductive trace lines) on a layer need not be vertically aligned with similar lines on other layers.

According to some embodiments, the first plurality of layers 420 includes, but is not limited to: a first ground layer (e.g., L8 in FIG. 4, or the like) among the one or more first ground layers 425 that is disposed on or above the substrate base or core layer 410; a first dielectric layer among the one or more first dielectric layers 440 on the first ground layer 425; a first power layer (e.g., L7 in FIG. 4, or the like) among the one or more first power layers 430 that is disposed on the first dielectric layer 440; a second dielectric layer among the one or more first dielectric layers 440 on the first power layer 430; a first signal layer (e.g., L6 in FIG. 4, or the like) among the one or more first signal layers 435 that is disposed on the second dielectric layer 440; a third dielectric layer among the one or more first dielectric layers 440 on the first signal layer 435; a second ground layer (e.g., L5 in FIG. 4, or the like) among the one or more first ground layers 425 that is disposed on the third dielectric layer 440; a fourth dielectric layer among the one or more first dielectric layers 440 on the second ground layer 425; a second signal layer (e.g., L4 in FIG. 4, or the like) among the one or more first signal layers 435 that is disposed on the fourth dielectric layer 440; a fifth dielectric layer among the one or more first dielectric layers 440 on the second signal layer 435; a second power layer (e.g., L3 in FIG. 4, or the like) among the one or more first power layers 430 that is disposed on the fifth dielectric layer 440; a sixth dielectric layer among the one or more first dielectric layers 440 on the second power layer 430; a third signal layer (e.g., L2 in FIG. 4, or the like) among the one or more first signal layers 435 that is disposed on the sixth dielectric layer 440; a seventh dielectric layer among the one or more first dielectric layers 440 on the third signal layer 435; and a third ground layer (e.g., L1 in FIG. 4, or the like) among the one or more first ground layers 425 that is disposed on the seventh dielectric layer 440.

Because impedance between power and ground layers (or planes) is defined by $1/\omega c'$ where $\omega$ denotes frequency and (' denotes capacitance, at high frequencies (e.g., kHz, MHz, etc.), the impedance approaches zero, thereby providing a return path along ground and power layers for high frequency signals carried by signal layers. Accordingly, herein, "high frequency signal(s)" may refer to a signal(s) having a frequency that is 1 kHz or greater. In some instances, the closest power layer and the closest ground layer to each signal layer each provides a return path for high frequency signals carried by said each signal layer based on magnetic induction. For example, the first power layer 430 (L7) and the second ground layer 425 (L5) each provides a return path for high frequency signals carried by the first signal layer 435 (L6). Likewise, the second ground layer 425 (L5) and the second power layer 430 (L3) each provides a return path for high frequency signals carried by the second signal layer 435 (L4). Similarly, the second power layer 430 (L3) and the third ground layer 425 (L1) each provides a return path for high frequency signals carried by the third signal layer 435 (L2). This enables high frequency (or high speed) signals to be routed between ground and power layers (or planes), instead of between ground planes only, thereby potentially reducing the substrate layer count.

In some instances, although not shown, the first plurality of layers 420 further includes additional signal, power, ground, and/or dielectric layers, with each additional signal layer being disposed between an additional power layer on one side and an additional ground layer on the other side, with dielectric layers each disposed between each of two adjacent ones of the signal, power, or ground layers. The adjacent power and ground layers that are disposed on either side of a signal layer each provides a return path for high frequency signals carried by said signal layer, in a manner as described above. Alternatively, also not shown, the first plurality of layers may include fewer layers, while maintaining the G/S/P arrangement.

In some embodiments, the first plurality of layers 420 further comprises a solder mask layer 445 as a top-most layer among other layers of the first plurality of layers 420. In some cases, the semiconductor package 405 further includes, but is not limited to: a semiconductor chip or die for a chip 450 that is mounted on or above the top-most layer of the first plurality of layers (in this case, solder mask layer 445, or the like); at least one decoupling capacitor (not shown in FIG. 4) that is mounted on or above the top-most layer of the first plurality of layers in proximity to the semiconductor chip 450; and at least one alternating current ("AC") coupler 455 that is mounted on or above the top-most layer of the first plurality of layers. In some instances, the at least one decoupling capacitor may be coupled to a top-most power layer (such as, but not limited to, L3, or the like) among the one or more first power layers 430 and a ground layer (such as, but not limited to, L1, or the like) among the one or more first ground layers 425, the at least one decoupling capacitor being configured to reduce or prevent rapid power supply fluctuations, thereby maintaining power integrity of any power that is supplied to the semiconductor chip via at least one power layer (e.g., by absorbing energy, whether stable or fluctuating (including low amplitude fluctuations, high amplitude fluctuations, low frequency fluctuations, high frequency fluctuations, etc.), from the power supply via the at least one power layer, and subsequently discharging at a (stable) predetermined rate(s), etc.), and the like.

In some cases, the at least one AC coupler 455 is coupled to each of at least one power layer among the one or more first power layers and at least one ground layer among the one or more first ground layers, without any portion of any of the one or more first power layers that is near (or within a first distance from) an edge of the substrate base or core layer being anchored to the substrate base or core layer (thereby resulting in "cantilevered" power layers, as the power layers are anchored to substrate base or core layer 410 at a portion that is proximate to the semiconductor chip or die 450 (e.g., anchored to a middle portion of the substrate base or core layer 410) but not anchored to the substrate layer 410 near an edge of the substrate layer 410), the first distance being defined by half a distance between the edge of the core layer and a closest edge of one of a semiconductor chip or a mount for the chip that is mounted on or above the semiconductor substrate. In some embodiments, each AC coupler among the at least one AC coupler 455 is configured to reduce noise signals carried by each of the at least one first power layer to which it is coupled. In some instances, the at least one AC coupler 455 is disposed on or above the first plurality of layers 420. In some cases, the at least one AC coupler 455 each includes, without limitation, one of one or more capacitors, one or more inductors, one or more metal traces, one or more small gaps, one or more dielectric materials, or one or more structures with dielectric sub-structures, and/or the like. Alternatively, or additionally, at least a portion of the at least one AC coupler 455 is disposed within the first plurality of layers 420 (not shown in FIG. 4). In some cases, the at least a portion of the at least one AC coupler 455 each includes, but is not limited to, one of one or more capacitors, one or more inductors, one or more metal traces, one or more small gaps, one or more vias, one or more dielectric materials, or one or more structures with dielectric sub-structures, and/or the like.

In some instances, the second plurality of layers 460 includes, without limitation: one or more second ground layers 465 (e.g., L9, L12, and L16 in FIG. 4, or the like) disposed on or below the substrate base or core layer 410; one or more second power layers 470 (e.g., L10 and L14 in FIG. 4, or the like) disposed on or below the substrate base or core layer 410; one or more second signal layers 475 (e.g., L11, L13, and L15 in FIG. 4, or the like) disposed on or below the substrate base or core layer 410, each signal layer among the one or more second signal layers 475 being disposed between a closest power layer among the one or more second power layers 470 and a closest ground layer among the one or more second ground layers 465, the closest power layer 470 and the closest ground layer 465 each providing a return path for high frequency signals carried by said each signal layer 475; a plurality of second dielectric layers 480, each dielectric layer 480 being disposed between and in contact with two of a power layer among the one or more second power layers 470, a ground layer among the one or more second ground layers 465, or a signal layer among the one or more second signal layers 475; and a solder mask layer 485 as a bottom-most layer among other layers of the second plurality of layers 460 that is furthest from the substrate base or core layer 410. According to some embodiments, the first plurality of layers 420 and the second plurality of layers 460 may each include, without limitation, any suitable or appropriate number of layers in direct contact with adjacent layers, or any suitable or appropriate number of intervening layers (including, but not limited to, one or more dielectric layers, one or more power layers, one or more signal layers, or one or more other layers, and/or the like) between pairs of layers, and/or the like. Similarly, in some cases, the first plurality of layers 420 and the second plurality of layers 460 may each directly contact the substrate base or core layer 410, while, in other cases, one or more intervening layers may be included between the substrate base or core layer 410 and each of the first plurality of layers 420 and the second plurality of layers 460.

In some embodiments, the semiconductor package 405 further includes, but is not limited to, one or more anchors, solder balls, or anchor balls 490, including at least one of one or more signal balls and one or more ground balls. Although described as signal/ground anchors or balls, these anchors may be embodied by any suitable shape of the solder that has solidified over the corresponding vias or the like, where its shape may be dictated by surrounding features or components of the area in which the solder is applied until solidifying. In some cases, at least one signal ball or anchor is disposed on or below the bottom-most layer 485 of the second plurality of layers 460 that is furthest from the substrate base or core layer 410, and at least one ground ball or anchor is disposed on or below the bottom-most layer 485 of the second plurality of layers 460. In some instances, the at least one signal ball or anchor is connected to the one or more first signal layers 435 of the first plurality of layers 420 and the one or more second signal layers 475 of the second plurality of layers 460 (or portions thereof) near the edge of the substrate base or core layer 410 and through the substrate base or core layer 410, thereby anchoring the one or more signal layers 435 of the first plurality of layers 420 and the one or more second signal layers 475 of the second plurality of layers 420 (or portions thereof) that are near the edge of the substrate base or core layer 410 to the substrate base or core layer 410. In some cases, the at least one ground ball or anchor is connected to the one or more ground layers 425 of the first plurality of layers 420 and the one or more second ground layers 465 of the second plurality of layers 460 (or portions thereof) near the edge of the substrate base or core layer 410 and through the substrate base or core layer 410, thereby anchoring the one or more ground layers 425 of the first plurality of layers 420 and the one or more second ground layers 465 of the second plurality of layers 460 (or portions thereof) that are near the edge of the substrate base or core layer 410 to the substrate base or core layer 410.

In some instances, the at least one AC coupler 455 is coupled to two or more of the at least one power layer 430 among the one or more first power layers 430, the at least one ground layer 425 among the one or more first ground layers 425, at least one power layer 470 among the one or more second power layers 470, or at least one ground layer 465 among the one or more second ground layers 465, without any portion of any of the one or more first power layers 430 and the one or more second power layers 470 that is near the edge of the substrate base or core layer 410 being anchored to the substrate base or core layer 410. In some cases, a ground layer of the one or more first ground layers 425 is at least one of a top-most layer of the first plurality of layers 420 and a bottom-most layer of the first plurality of layers 420 (not including the solder mask 445). Similarly, a ground layer of the one or more second ground layers 465 is at least one of a top-most layer of the second plurality of layers 460 and a bottom-most layer of the second plurality of layers 460 (not including the solder mask 485).

These and other functions of the system 400 (and its components) are described in greater detail with respect to FIGS. 2, 3, and 5.

FIGS. 5A-5E (collectively, "FIG. 5") are flow diagrams illustrating a method 500 for implementing cantilevered power planes to provide a return current path for high-speed signals, in accordance with various embodiments. Method 500 of FIG. 5A continues onto FIG. 5B following the circular marker denoted, "A" or "C," and returns to FIG. 5A following the circular marker denoted, "B." Method 500 of FIG. 5A continues onto FIG. 5C following the circular marker denoted, "D." Method 500 of FIG. 5D continues onto FIG. 5E following the circular marker denoted, "E."

While the techniques and procedures are depicted and/or described in a certain order for purposes of illustration, it should be appreciated that certain procedures may be reordered and/or omitted within the scope of various embodiments. Moreover, while the method 500 illustrated by FIG. 5 can be implemented by or with (and, in some cases, are described below with respect to) the systems, examples, or embodiments 200, 200', 300, and 400 of FIGS. 2A, 2B, 3, and 4, respectively (or components thereof), such methods may also be implemented using any suitable hardware (or software) implementation. Similarly, while each of the systems, examples, or embodiments 200, 200', 300, and 400 of FIGS. 2A, 2B, 3, and 4, respectively (or components thereof), can operate according to the method 500 illustrated by FIG. 5 (e.g., by executing instructions embodied on a computer readable medium), the systems, examples, or embodiments 200, 200', 300, and 400 of FIGS. 2A, 2B, 3, and 4 can each also operate according to other modes of operation and/or perform other suitable procedures.

Figure 5A:
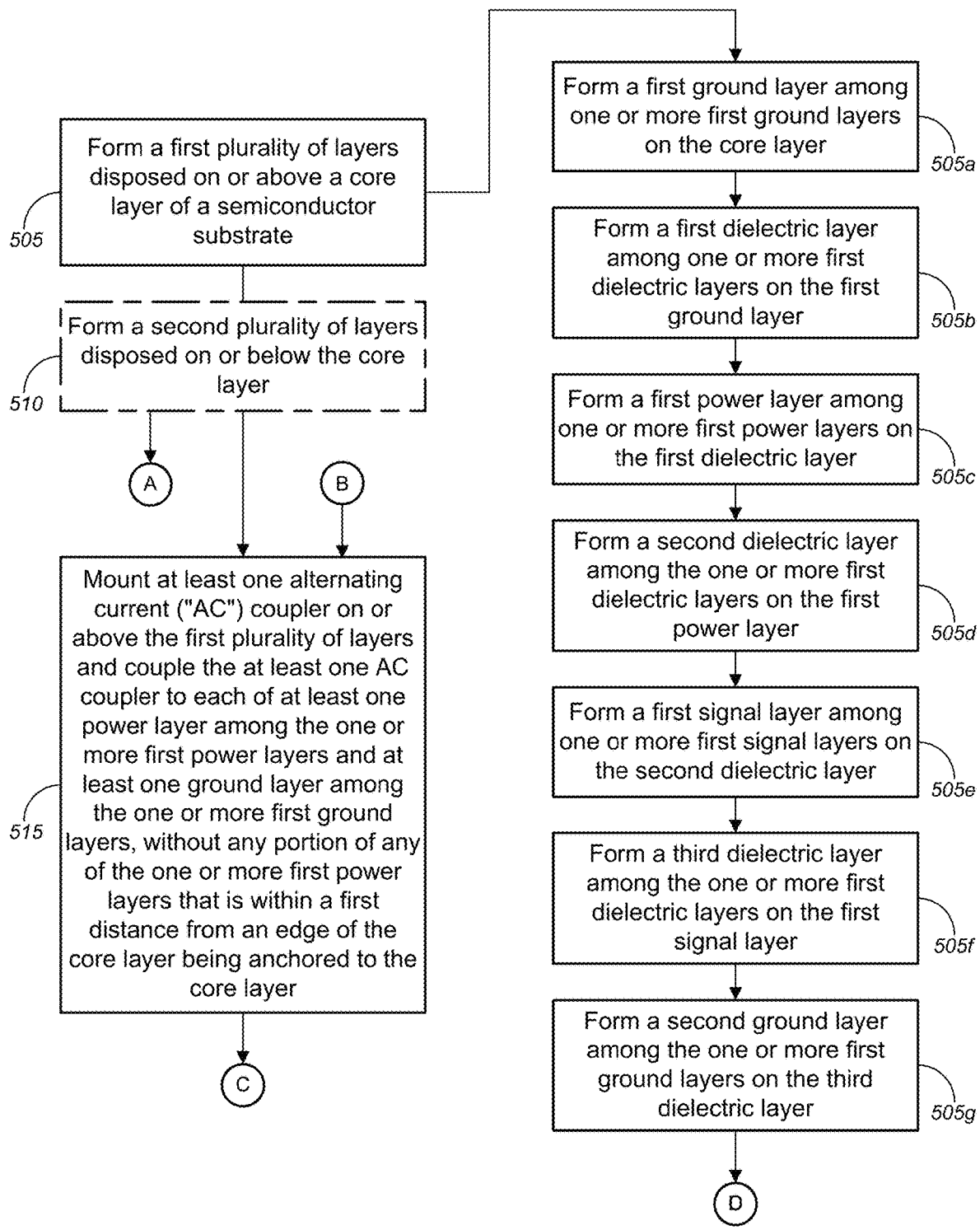
FIGS. 5A-5E are flow diagrams illustrating a method for implementing cantilevered power planes to provide a return current path for high-speed signals, in accordance with various embodiments.

In the non-limiting embodiment of FIG. 5A, method 500, at block 505, comprises forming a first plurality of layers disposed on or above (a top surface of) a core layer of a semiconductor substrate. According to some embodiments, method 500 further comprises, at optional block 510, forming a second plurality of layers disposed on or below (a bottom surface of) the core layer.

Figure 5B:
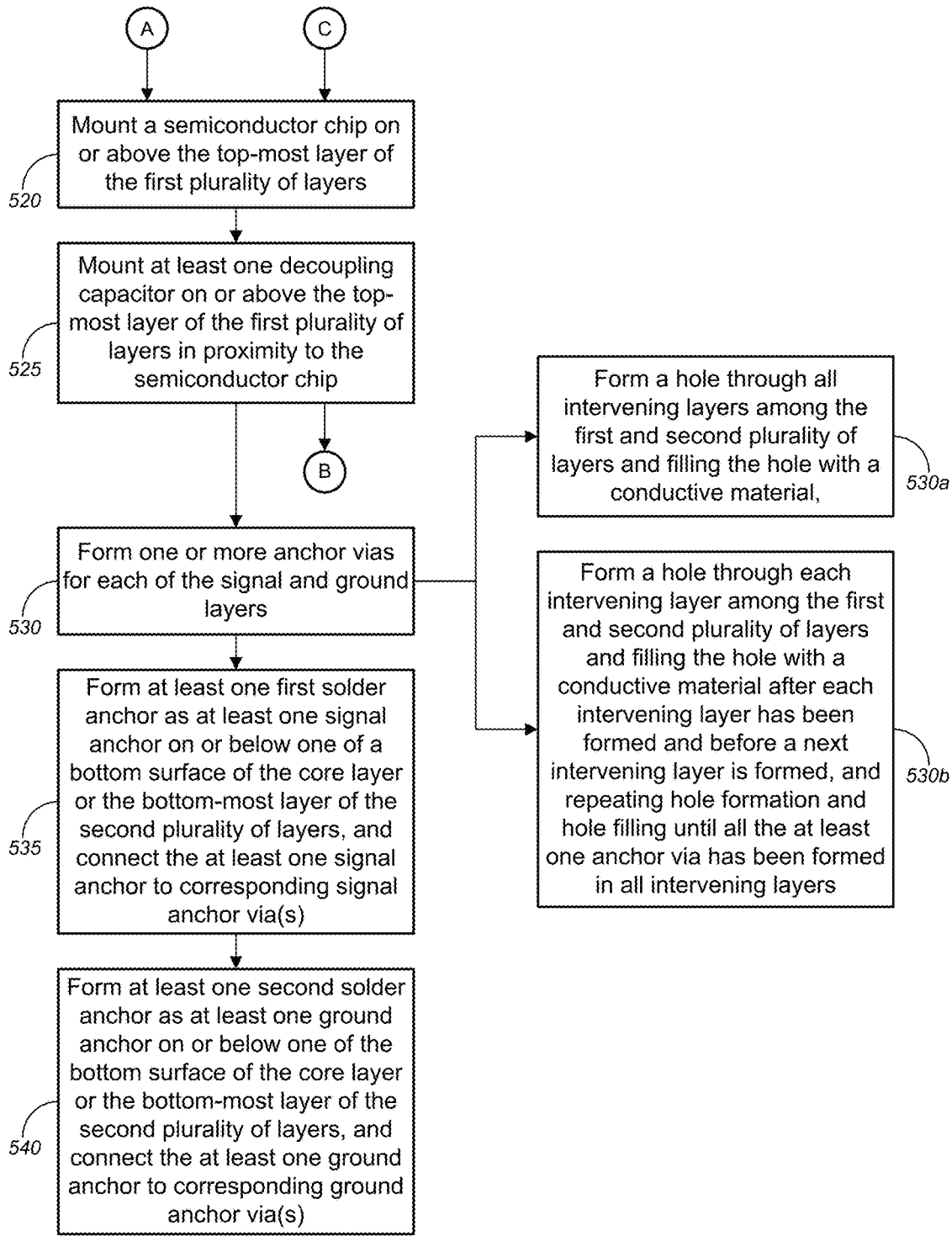

Method 500 either continues onto the process at block 515 or continues onto the process at block 520 in FIG. 5B following the circular marker denoted, "A."

At block 515, method 500 comprises mounting at least one alternating current ("AC") coupler on or above the first plurality of layers and coupling the at least one AC coupler to each of at least one power layer among the one or more first power layers and at least one ground layer among the one or more first ground layers, without any portion of any of the one or more first power layers that is within a first distance from (e.g., near) an edge of the core layer being anchored to the core layer, the first distance being half a distance between the edge of the core layer and a closest edge of one of a semiconductor chip or a mount for the chip that is mounted on or above the semiconductor substrate.

In some embodiments, each AC coupler among the at least one AC coupler is configured to reduce noise signals carried by each of the at least one power layer to which it is coupled. In some instances, the at least one AC coupler each comprises one of one or more capacitors, one or more inductors, one or more metal traces, one or more small gaps, one or more dielectric materials, or one or more structures with dielectric sub-structures, and/or the like. Alternatively, or additionally, at least a portion of the at least one AC coupler is disposed within the first plurality of layers. In some cases, the at least a portion of the at least one AC coupler each comprises one of one or more capacitors, one or more inductors, one or more metal traces, one or more small gaps, one or more vias, one or more dielectric materials, or one or more structures with dielectric sub-structures, and/or the like.

Method 500 continues onto the process at block 520 in FIG. 5B following the circular marker denoted, "C."

In some embodiments, forming a first plurality of layers (at block 505) comprises: forming a first ground layer among one or more first ground layers on the core layer (block 505a); forming a first dielectric layer among one or more first dielectric layers on the first ground layer (block 505b); forming a first power layer among one or more first power layers on the first dielectric layer (block 505c); forming a second dielectric layer among the one or more first dielectric layers on the first power layer (block 505d); forming a first signal layer among one or more first signal layers on the second dielectric layer (block 505e); forming a third dielectric layer among the one or more first dielectric layers on the first signal layer (block 505f); and forming a second ground layer among the one or more first ground layers on the third dielectric layer (block 505g). In some cases, the first power layer and the second ground layer each provides a return path for high frequency signals (e.g., signals having a frequency of 1 kHz or greater) carried by the first signal layer.

According to some embodiments, the at least one AC coupler is coupled to two or more of the at least one power layer among the one or more first power layers, the at least one ground layer among the one or more first ground layers, at least one power layer among the one or more second power layers, or at least one ground layer among the one or more second ground layers, without any portion of any of the one or more first power layers and the one or more second power layers that is near (e.g., within the first distance from) the edge of the core layer being anchored to the core layer.

Figure 5C:
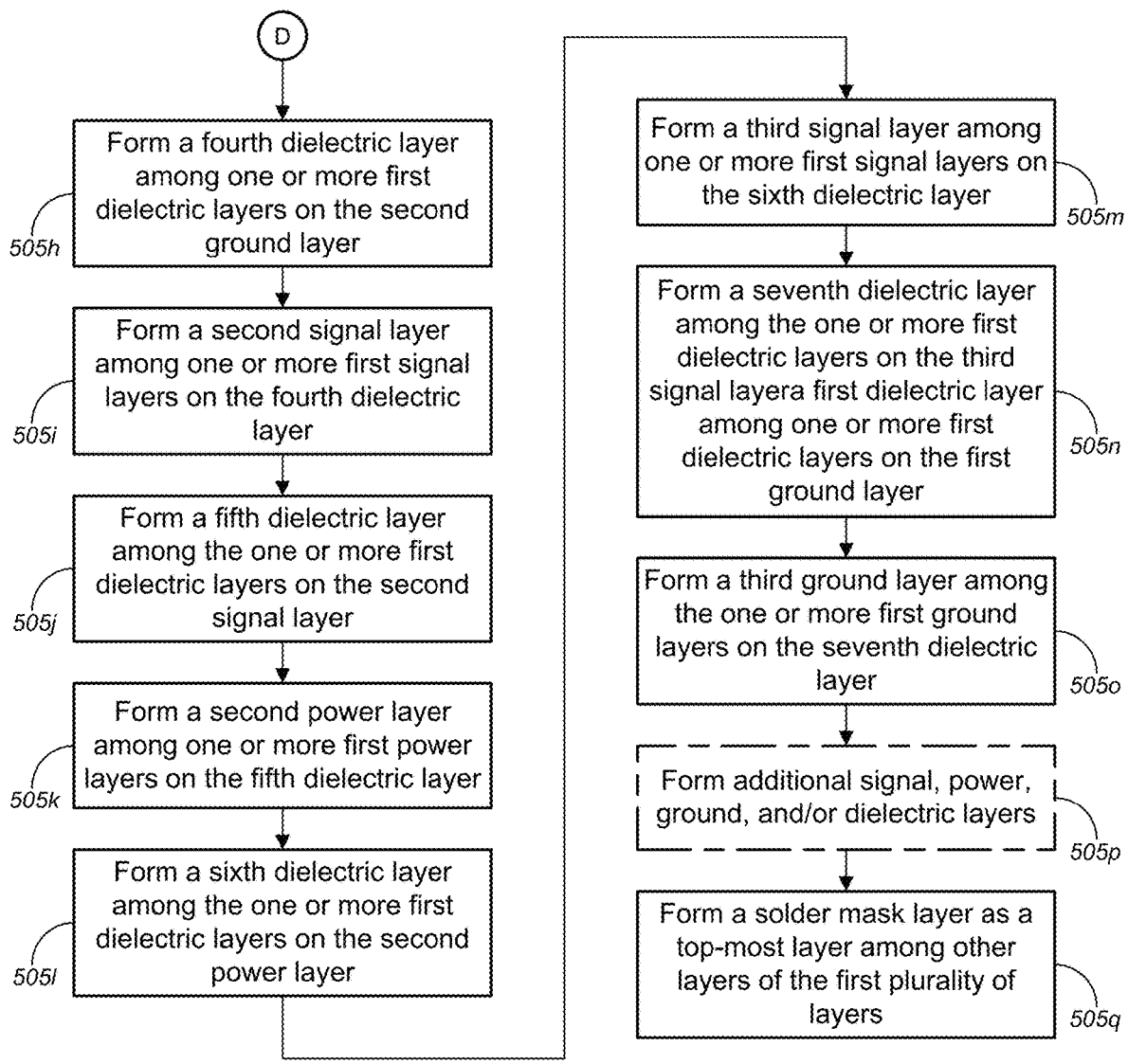

Method 500 continues onto the process at block 505h in FIG. 5C following the circular marker denoted, "D."

At block 520 in FIG. 5B (following the circular marker denoted, "A" or "C"), method 500 comprises mounting a semiconductor chip on or above the top-most layer of the first plurality of layers. Method 500 further comprises, at block 525, mounting at least one decoupling capacitor on or above the top-most layer of the first plurality of layers in proximity to the semiconductor chip, the at least one decoupling capacitor being coupled to a top-most power layer among the one or more first power layers and a ground layer among the one or more first ground layers, the at least one decoupling capacitor being configured to reduce or prevent rapid power supply fluctuations, thereby maintaining power integrity of any power that is supplied to the semiconductor chip via at least one power layer. In the case that the at least one AC coupler has not been mounted (at block 515), method 500 returns to the process at block 515 in FIG. 5A following the circular marker denoted, "B." Otherwise, method 500 continues onto the process at block 530.

At block 530, method 500 comprises forming one or more anchor vias for each of the signal and ground layers. In some cases, forming the one or more anchor vias for each of the signal and ground layers (at block 530) comprises one of: forming a hole through all intervening layers among the first and second plurality of layers and filling the hole with a conductive material (block 530a), wherein a corresponding one of the at least one signal anchor or the at least one ground anchor is formed to make contact with the conductive material; or forming a hole through each intervening layer among the first and second plurality of layers and filling the hole with a conductive material after each intervening layer has been formed and before a next intervening layer is formed, and repeating hole formation and hole filling until all the at least one anchor via has been formed in all intervening layers (block 530b), wherein a corresponding one of the at least one signal anchor or the at least one ground anchor is formed to make contact with the conductive material; and/or the like.

Method 500 further comprises, at block 535, forming at least one first solder anchor as at least one signal anchor on or below one of a bottom surface of the core layer or the bottom-most layer of the second plurality of layers (or above when the semiconductor package is rotated bottom surface up), and connecting the at least one signal anchor to corresponding at least one signal anchor via, thus mechanically (and electrically) connecting the at least one signal anchor (via the corresponding at least one signal anchor via) to the one or more signal layers of the first plurality of layers and the one or more second signal layers of the second plurality of layers near the edge of the core layer and through the core layer, thereby anchoring the one or more signal layers of the first plurality of layers and the one or more second signal layers of the second plurality of layers that are near (e.g., within the first distance from) the edge of the core layer to the core layer.

Method 500, at block 540, comprises forming at least one second solder anchor as at least one ground anchor on or below one of the bottom surface of the core layer or the bottom-most layer of the second plurality of layers (or above when the semiconductor package is rotated bottom surface up), and connecting the at least one ground anchor to corresponding at least one ground anchor via, thus mechanically (and electrically) connecting the at least one ground anchor (via the corresponding at least one ground anchor via) to the one or more ground layers of the first plurality of layers and the one or more second ground layers of the second plurality of layers near the edge of the core layer and through the core layer, thereby anchoring the one or more ground layers of the first plurality of layers and the one or more second ground layers of the second plurality of layers that are near (e.g., within the first distance from) the edge of the core layer to the core layer.

At block 505h in FIG. 5C (following the circular marker denoted, "D"), method 500 may comprise forming a fourth dielectric layer among one or more first dielectric layers on the second ground layer; forming a second signal layer among one or more first signal layers on the fourth dielectric layer (block 505i); forming a fifth dielectric layer among the one or more first dielectric layers on the second signal layer (block 505j); forming a second power layer among one or more first power layers on the fifth dielectric layer (block 505k); forming a sixth dielectric layer among the one or more first dielectric layers on the second power layer (block 505l); forming a third signal layer among one or more first signal layers on the sixth dielectric layer (block 505m); forming a seventh dielectric layer among the one or more first dielectric layers on the third signal layer (block 505n); and forming a third ground layer among the one or more first ground layers on the seventh dielectric layer (block 505o). In some instances, the second ground layer and the second power layer each provides a return path for high frequency signals (e.g., signals having a frequency of 1 kHz or greater) carried by the second signal layer. In some cases, the second power layer and the third ground layer each provides a return path for high frequency signals (e.g., signals having a frequency of 1 kHz or greater) carried by the third signal layer.

In some embodiments, forming a first plurality of layers (at block 505) further comprises: forming additional signal, power, ground, and/or dielectric layers (optional block 505p), with each additional signal layer being disposed between an additional power layer on one side and an additional ground layer on the other side, with dielectric layers each disposed between each of two adjacent ones of the signal, power, or ground layers. The adjacent power and ground layers that are disposed on either side of a signal layer each provides a return path for high frequency signals carried by said signal layer.

According to some embodiments, forming a first plurality of layers (at block 505) further comprises: forming a solder mask layer as a top-most layer among other layers of the first plurality of layers (block 505q).

Figure 5D:
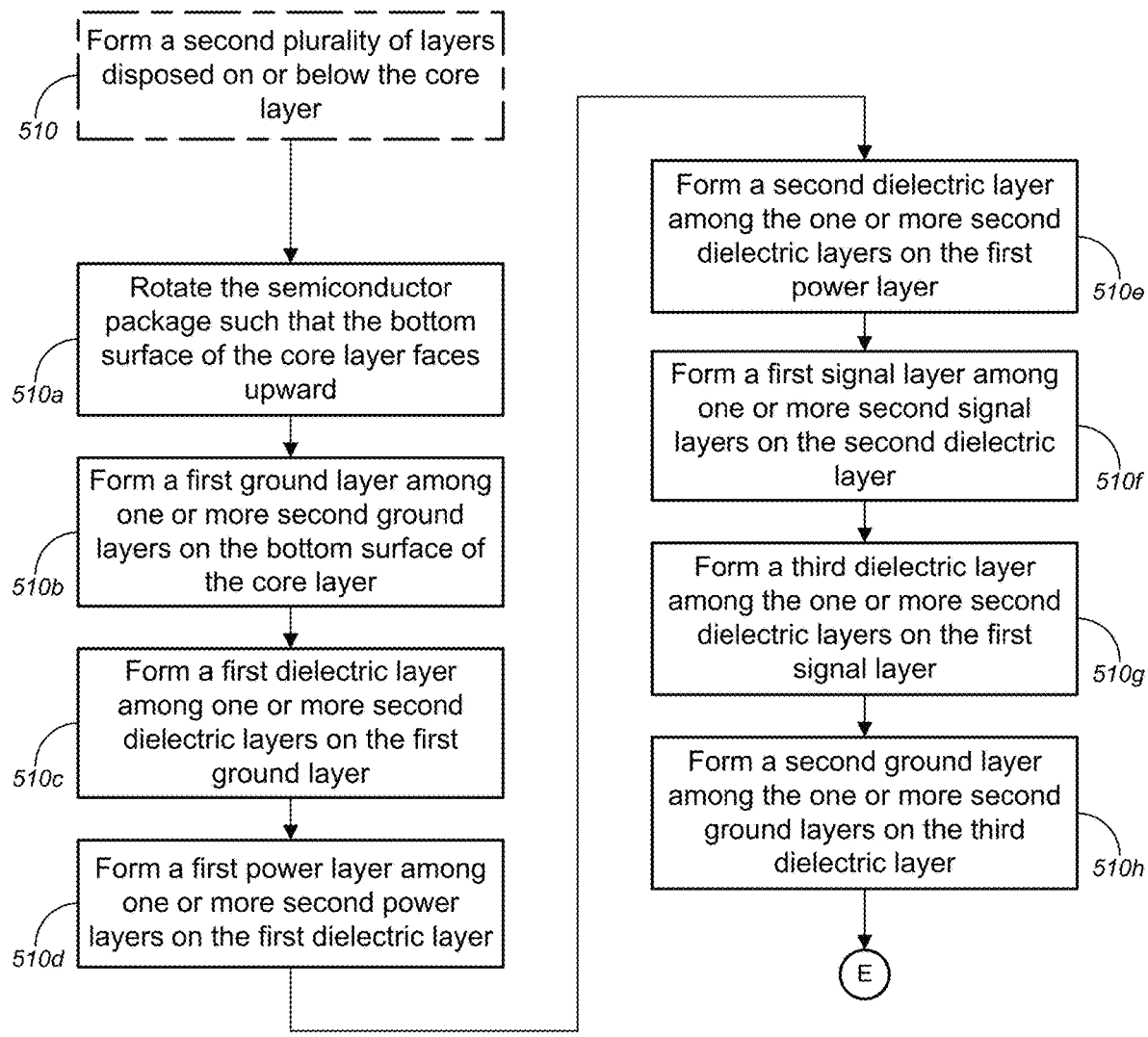

With reference to FIG. 5D, forming a second plurality of layers disposed on or below the core layer (at optional block 510) comprises: rotating the semiconductor package such that the bottom surface of the core layer faces upward (block 510a); forming a first ground layer among one or more second ground layers on the bottom surface of the core layer (block 510b); forming a first dielectric layer among one or more second dielectric layers on the first ground layer (block 510c); forming a first power layer among one or more second power layers on the first dielectric layer (block 510d); forming a second dielectric layer among the one or more second dielectric layers on the first power layer (block 510e); forming a first signal layer among one or more second signal layers on the second dielectric layer (block 510f); forming a third dielectric layer among the one or more second dielectric layers on the first signal layer (block 510g); and forming a second ground layer among the one or more second ground layers on the third dielectric layer (block 510h). In some cases, the first power layer and the second ground layer each provides a return path for high frequency signals carried by the first signal layer.

Figure 5E:
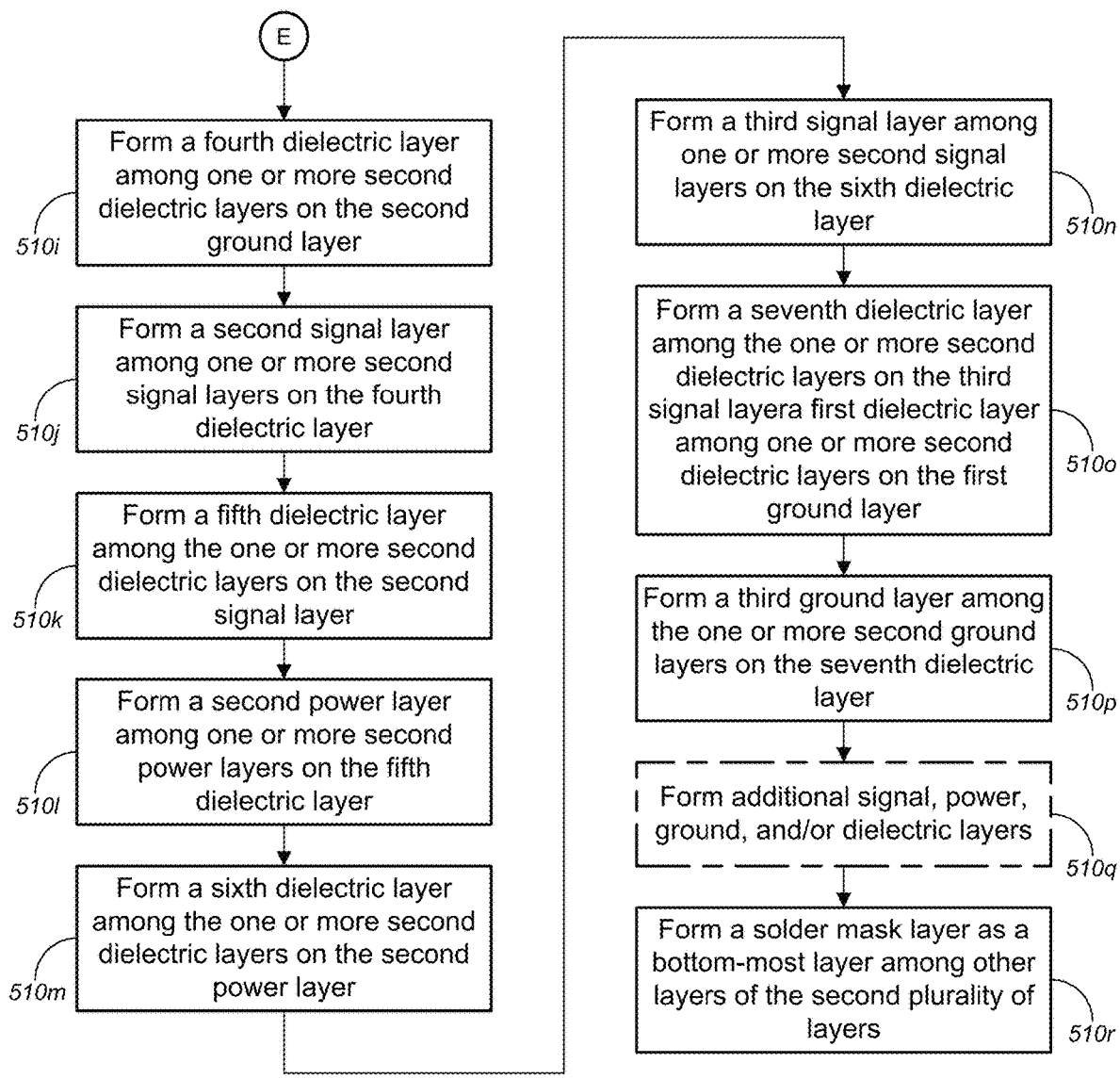

Method 500 continues onto the process at block 510i in FIG. 5E following the circular marker denoted, "E."

At block 510i in FIG. 5E (following the circular marker denoted, "E"), method 500 may comprise forming a fourth dielectric layer among one or more second dielectric layers on the second ground layer; forming a second signal layer among one or more second signal layers on the fourth dielectric layer (block 510j); forming a fifth dielectric layer among the one or more second dielectric layers on the second signal layer (block 510k); forming a second power layer among one or more second power layers on the fifth dielectric layer (block 510l); forming a sixth dielectric layer among the one or more second dielectric layers on the second power layer (block 510m); forming a third signal layer among one or more second signal layers on the sixth dielectric layer (block 510n); forming a seventh dielectric layer among the one or more second dielectric layers on the third signal layer (block 510o); and forming a third ground layer among the one or more second ground layers on the seventh dielectric layer (block 510p). In some instances, the second ground layer and the second power layer each provides a return path for high frequency signals carried by the second signal layer. In some cases, the second power layer and the third ground layer each provides a return path for high frequency signals carried by the third signal layer.

In some embodiments, forming a first plurality of layers (at block 510) further comprises: forming additional signal, power, ground, and/or dielectric layers (optional block 510q), with each additional signal layer being disposed between an additional power layer on one side and an additional ground layer on the other side, with dielectric layers each disposed between each of two adjacent ones of the signal, power, or ground layers. The adjacent power and ground layers that are disposed on either side of a signal layer each provides a return path for high frequency signals carried by said signal layer.

According to some embodiments, forming a first plurality of layers (at block 510) further comprises: forming a solder mask layer as a bottom-most layer among other layers of the second plurality of layers that is furthest from the core layer, when the semiconductor package is rotated such that the first plurality of layers is facing upward and the second plurality of layers is facing downward (block 510r).

While particular features and aspects have been described with respect to some embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while particular functionality is ascribed to particular system components, unless the context dictates otherwise, this functionality need not be limited to such and can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without-particular features for ease of description and to illustrate some aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A semiconductor package, comprising:
   a semiconductor substrate comprising:
      a core layer;
      a first plurality of layers disposed on or above the core layer, the first plurality of layers comprising:
         one or more first power layers disposed on or above the core layer;
         one or more first ground layers disposed on or above the core layer;
         one or more first signal layers disposed on or above the core layer, each signal layer among the one or more first signal layers being disposed between a closest power layer among the one or more first power layers and a closest ground layer among the one or more first ground layers, the closest power layer and the closest ground layer each providing a return path for high frequency signals carried by said each signal layer; and
         a plurality of first dielectric layers, each dielectric layer being disposed between and in contact with two of a power layer among the one or more first power layers, a ground layer among the one or more first ground layers, or a signal layer among the one or more first signal layers; and
   at least one alternating current ("AC") coupler coupled to each of at least one power layer among the one or more first power layers and at least one ground layer among the one or more first ground layers, without any portion of any of the one or more first power layers that is within a first distance from an edge of the core layer being anchored to the core layer, the first distance being half a distance between the edge of the core layer and a closest edge of one of a semiconductor chip or a mount for the chip that is mounted on or above the semiconductor substrate.

2. The semiconductor package of claim 1, wherein each AC coupler among the at least one AC coupler is configured to reduce noise signals carried by each of the at least one first power layer to which it is coupled.

3. The semiconductor package of claim 1, wherein the at least one AC coupler is disposed on or above the first plurality of layers, wherein the at least one AC coupler each comprises one of one or more capacitors, one or more inductors, one or more metal traces, one or more small gaps, one or more dielectric materials, or one or more structures with dielectric sub-structures.

4. The semiconductor package of claim 1, wherein at least a portion of the at least one AC coupler is disposed within the first plurality of layers, wherein the at least a portion of the at least one AC coupler each comprises one of one or more capacitors, one or more inductors, one or more metal traces, one or more small gaps, one or more vias, one or more dielectric materials, or one or more structures with dielectric sub-structures.

5. The semiconductor package of claim 1, wherein the closest power layer and the closest ground layer to each signal layer each provides a return path for high frequency signals carried by said each signal layer based on magnetic induction.

6. The semiconductor package of claim 1, wherein the first plurality of layers further comprises a solder mask layer as a top-most layer among other layers of the first plurality of layers, wherein the semiconductor package further comprises:
   the semiconductor chip that is mounted on or above the top-most layer of the first plurality of layers; and
   at least one decoupling capacitor that is mounted on or above the top-most layer of the first plurality of layers in proximity to the semiconductor chip, the at least one decoupling capacitor being coupled to a top-most power layer among the one or more first power layers and a ground layer among the one or more first ground layers, the at least one decoupling capacitor being configured to reduce or prevent rapid power supply fluctuations.

7. The semiconductor package of claim 1, wherein the core layer comprises a top surface and a bottom surface, wherein the first plurality of layers is disposed on or above the top surface of the core layer, wherein the semiconductor package further comprises:
   a second plurality of layers disposed on or below the bottom surface of the core layer, the second plurality of layers comprising:
      one or more second power layers disposed on or below the core layer;
      one or more second ground layers disposed on or below the core layer;
      one or more second signal layers disposed on or below the core layer, each signal layer among the one or more second signal layers being disposed between a closest power layer among the one or more second power layers and a closest ground layer among the one or more second ground layers, the closest power 11 layer and the closest ground layer each providing a return path for high 12 frequency signals carried by said each signal layer; and
      a plurality of second dielectric layers, each dielectric layer being disposed between and in contact with two of a power layer among the one or more second power layers, a ground layer among the one or more second ground layers, or a signal layer among the one or more second signal layers; and
   at least one signal anchor disposed on or below a bottom-most layer of the second plurality of layers that is furthest from the core layer, the at least one signal anchor being connected to the one or more signal layers of the first plurality of layers and the one or more second signal layers of the second plurality of layers near the edge of the 21 core layer and through the core layer, thereby anchoring the one or more signal layers 22 of the first plurality of layers and the one or more second signal layers of the second plurality of layers that are near the edge of the core layer to the core layer; and at least one ground anchor disposed on or below the bottom-most layer of the second plurality of layers, the at least one ground anchor being connected to the one or more ground layers of the first plurality of layers and the one or more second ground layers of the second plurality of layers near the edge of the core layer and through the core layer, thereby anchoring the one or more ground layers of the first plurality of layers and the one or more second ground layers of the second plurality of layers that are near the edge of the core layer to the core layer.

8. The semiconductor package of claim 7, wherein the at least one AC coupler is coupled to two or more of the at least one power layer among the one or more first power layers, the at least one ground layer among the one or more first ground layers, at least one power layer among the one or more second power layers, or at least one ground layer among the one or more second ground layers, without any portion of any of the one or more first power layers and the one or more second power layers that is near the edge of the core layer being anchored to the core layer.

9. The semiconductor package of claim 7, wherein a ground layer of the one or more first ground layers is at least one of a top-most layer of the first plurality of layers and a bottom-most layer of the first plurality of layers, wherein a ground layer of the one or more second ground layers is at least one of a top-most layer of the second plurality of layers and a bottom-most layer of the second plurality of layers.

10. The semiconductor package of claim 1, wherein the first plurality of layers comprises:
a first ground layer among the one or more first ground layers that is disposed on or above the core layer;
a first dielectric layer among the one or more first dielectric layers on the first ground layer;
a first power layer among the one or more first power layers that is disposed on the first dielectric layer;
a second dielectric layer among the one or more first dielectric layers on the first power layer;
a first signal layer among the one or more first signal layers that is disposed on the second dielectric layer;
a third dielectric layer among the one or more first dielectric layers on the first signal layer;
a second ground layer among the one or more first ground layers that is disposed on the third dielectric layer;
a fourth dielectric layer among the one or more first dielectric layers on the second ground layer;
a second signal layer among the one or more first signal layers that is disposed on the fourth dielectric layer;
a fifth dielectric layer among the one or more first dielectric layers on the second signal layer;
a second power layer among the one or more first power layers that is disposed on the fifth dielectric layer;
a sixth dielectric layer among the one or more first dielectric layers on the second power layer;
a third signal layer among the one or more first signal layers that is disposed on the sixth dielectric layer;
a seventh dielectric layer among the one or more first dielectric layers on the third signal layer; and
a third ground layer among the one or more first ground layers that is disposed on the seventh dielectric layer;
wherein the first power layer and the second ground layer each provides a return path for high frequency signals carried by the first signal layer, wherein the second ground layer and the second power layer each provides a return path for high frequency signals carried by the second signal layer, wherein the second power layer and the third ground layer each provides a return path for high frequency signals carried by the third signal layer.

11. A method, comprising:
forming a first plurality of layers disposed on or above a core layer of a semiconductor substrate, comprising:
forming a first ground layer among one or more first ground layers on the core layer;
forming a first dielectric layer among one or more first dielectric layers on the first ground layer;
forming a first power layer among one or more first power layers on the first dielectric layer;
forming a second dielectric layer among the one or more first dielectric layers on the first power layer;
forming a first signal layer among one or more first signal layers on the second dielectric layer;
forming a third dielectric layer among the one or more first dielectric layers on the first signal layer; and
forming a second ground layer among the one or more first ground layers on the third dielectric layer, wherein the first power layer and the second ground layer each provides a return path for high frequency signals carried by the first 18 signal layer; and
mounting at least one alternating current ("AC") coupler on or above the first plurality of layers and coupling the at least one AC coupler to each of at least one power layer among the one or more first power layers and at least one ground layer among the one or more first ground layers, without any portion of any of the one or more first power layers that within a first distance from an edge of the core layer being anchored to the core layer, the first distance being half a distance between the edge of the core layer and a closest edge of one of a semiconductor chip or a mount for the chip that is mounted on or above the semiconductor substrate.

12. The method of claim 11, wherein each AC coupler among the at least one AC coupler is configured to reduce noise signals carried by each of the at least one power layer to which it is coupled.

13. The method of claim 11, wherein the at least one AC coupler each comprises one of one or more capacitors, one or more inductors, one or more metal traces, one or more small gaps, one or more dielectric materials, or one or more structures with dielectric sub-structures.

14. The method of claim 11, wherein at least a portion of the at least one AC coupler is disposed within the first plurality of layers, wherein the at least a portion of the at least one AC coupler each comprises one of one or more capacitors, one or more inductors, one or more metal traces, one or more small gaps, one or more vias, one or more dielectric materials, or one or more structures with dielectric sub-structures.

15. The method of claim 11, further comprising:
forming a solder mask layer as a top-most layer among other layers of the first plurality of layers;
mounting the semiconductor chip on or above the top-most layer of the first plurality of layers; and
mounting at least one decoupling capacitor on or above the top-most layer of the first plurality of layers in proximity to the semiconductor chip, the at least one decoupling capacitor being coupled to a top-most power layer among the one or more first power layers and a ground layer among the one or more first ground layers, the at least one decoupling capacitor being configured to reduce or prevent rapid power supply fluctuations.

16. The method of claim 11, wherein forming the first plurality of layers further comprises:
forming a fourth dielectric layer among one or more first dielectric layers on the second ground layer;
forming a second signal layer among one or more first signal layers on the fourth dielectric layer;
forming a fifth dielectric layer among the one or more first dielectric layers on the second signal layer;
forming a second power layer among one or more first power layers on the fifth dielectric layer;
forming a sixth dielectric layer among the one or more first dielectric layers on the second power layer;
forming a third signal layer among one or more first signal layers on the sixth dielectric layer;
forming a seventh dielectric layer among the one or more first dielectric layers on the third signal layer; and
forming a third ground layer among the one or more first ground layers on the seventh dielectric layer;
wherein the second ground layer and the second power layer each provides a return path for high frequency signals carried by the second signal layer, wherein the second power layer and the third ground layer each provides a return path for high frequency signals carried by the third signal layer.

17. The method of claim 11, wherein the core layer comprises a top surface and a bottom surface, wherein the first plurality of layers is disposed on or above the top surface of the core layer, wherein the method further comprises:
forming a second plurality of layers disposed on or below the core layer, comprising:
rotating the semiconductor package such that the bottom surface of the core layer faces upward;
forming a first ground layer among one or more second ground layers on or above the bottom surface of the core layer;
forming a first dielectric layer among one or more second dielectric layers on the first ground layer;
forming a first power layer among one or more second power layers on the first dielectric layer;
forming a second dielectric layer among the one or more second dielectric layers on the first power layer;
forming a first signal layer among one or more second signal layers on the second dielectric layer;
forming a third dielectric layer among the one or more second dielectric layers on the first signal layer; and
forming a second ground layer among the one or more second ground layers on the third dielectric layer, wherein the first power layer and the second ground layer each provides a return path for high frequency signals carried by the first signal layer.

18. The method of claim 17, wherein the at least one AC coupler is coupled to two or more of the at least one power layer among the one or more first power layers, the at least one ground layer among the one or more first ground layers, at least one power layer among the one or more second power layers, or at least one ground layer among the one or more second ground layers, without any portion of any of the one or more first power layers and the one or more second power layers that is near the edge of the core layer being anchored to the core layer.

19. The method of claim 17, further comprising:
forming a solder mask layer as a bottom-most layer among other layers of the second plurality of layers that is furthest from the core layer, when the semiconductor package is rotated such that the first plurality of layers is facing upward and the second plurality of layers is facing downward;
forming at least one first solder anchor as at least one signal anchor on or above the bottom-most layer of the second plurality of layers, the at least one signal anchor being connected, using corresponding at least one anchor via, to the one or more signal layers of the first plurality of layers and the one or more second signal layers of the second plurality of layers near the edge of the core layer and through the core layer, thereby anchoring the one or more signal layers of the first plurality of layers and the one or more second signal layers of the second plurality of layers that are near the edge of the core layer to the core layer;
forming at least one second solder anchor as at least one ground anchor on or above the bottom-most layer of the second plurality of layers, the at least one ground anchor being connected, using corresponding at least one anchor via, to the one or more ground layers of the first plurality of layers and the one or more second ground layers of the second plurality of layers near the edge of the core layer and through the core layer, thereby anchoring the one or more ground layers of the first plurality of layers and the one or more second ground layers of the second plurality of layers that are near the edge of the core layer to the core layer.

20. The method of claim 19, wherein each of the at least one anchor via is formed by a process comprising one of:
forming a hole through all intervening layers among the first and second plurality of layers and filling the hole with a conductive material, wherein a corresponding one of the at least one signal anchor or the at least one ground anchor is formed to make contact with the conductive material; or
forming a hole through each intervening layer among the first and second plurality of layers and filling the hole with a conductive material after each intervening layer has been formed and before a next intervening layer is formed, and repeating hole formation and hole filling until all the at least one anchor via has been formed in all intervening layers, wherein a corresponding one of the at least one signal anchor or the at least one ground anchor is formed to make contact with the conductive material.

* * * * *